US012727214B2

(12) United States Patent
Pal et al.

(10) Patent No.: US 12,727,214 B2
(45) Date of Patent: Sep. 1, 2026

(54) SOURCE DRAIN FORMATION IN GATE ALL AROUND TRANSISTOR

(71) Applicant: Applied Materials, Inc., Santa Clara, CA (US)

(72) Inventors: Ashish Pal, San Ramon, CA (US); El Mehdi Bazizi, San Jose, CA (US); Benjamin Colombeau, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 955 days.

(21) Appl. No.: 17/896,223

(22) Filed: Aug. 26, 2022

(65) Prior Publication Data

US 2023/0067331 A1 Mar. 2, 2023

Related U.S. Application Data

(60) Provisional application No. 63/238,270, filed on Aug. 30, 2021.

(51) Int. Cl.

| | |
|---|---|
| ***H10D 62/10*** | (2025.01) |
| ***H10D 30/01*** | (2025.01) |
| ***H10D 30/43*** | (2025.01) |
| ***H10D 30/67*** | (2025.01) |
| ***H10D 62/815*** | (2025.01) |

(Continued)

(52) U.S. Cl.

CPC ......... *H10D 62/116* (2025.01); *H10D 30/014* (2025.01); *H10D 62/8163* (2025.01); *H10D 62/83* (2025.01); *H10D 64/017* (2025.01); *H10D 30/43* (2025.01); *H10D 30/6735* (2025.01); *H10D 62/121* (2025.01)

(58) Field of Classification Search

None

See application file for complete search history.

(56) References Cited

U.S. PATENT DOCUMENTS

| | | | |
|---|---|---|---|
| 10,629,702 | B2 | 4/2020 | Zhenxing et al. |
| 2013/0049215 | A1 | 2/2013 | Larsen |

(Continued)

FOREIGN PATENT DOCUMENTS

| | | | |
|---|---|---|---|
| CN | 113206062 | A | 8/2021 |
| CN | 113675196 | A | 11/2021 |

(Continued)

OTHER PUBLICATIONS

PCT International Search Report and Written Opinion in PCT/US2022/041801 dated Dec. 21, 2022, 9 pages.

(Continued)

*Primary Examiner* — Dale E Page
*Assistant Examiner* — Derek L Nielsen
(74) *Attorney, Agent, or Firm* — SERVILLA WHITNEY LLC

(57) ABSTRACT

Semiconductor devices and methods of manufacturing the same are described. The method includes forming a bottom dielectric isolation (BDI) layer on a substrate and depositing a template material in the source/drain trench. The template material is etched and then crystallized. Epitaxially growth of the source and drain regions then proceeds, with growth advantageously occurring on the bottom and sidewalls of the source and drain regions.

20 Claims, 7 Drawing Sheets

(51) Int. Cl.

| | |
|---|---|
| ***H10D 62/83*** | (2025.01) |
| ***H10D 64/01*** | (2025.01) |

(56) References Cited

U.S. PATENT DOCUMENTS

| | | | | |
|---|---|---|---|---|
| 2015/0064933 | A1* | 3/2015 | Sharma | H10P 14/3814 438/795 |
| 2016/0099178 | A1 | 4/2016 | Zhang et al. | |
| 2016/0111495 | A1 | 4/2016 | Brand et al. | |
| 2017/0271514 | A1 | 9/2017 | Kittl et al. | |
| 2018/0301341 | A1 | 10/2018 | Coquand et al. | |
| 2019/0157310 | A1 | 5/2019 | Glass et al. | |
| 2019/0378842 | A1 | 12/2019 | Reznicek et al. | |
| 2020/0227306 | A1 | 7/2020 | Cheng et al. | |
| 2020/0350215 | A1* | 11/2020 | Zhang | H10D 64/017 |
| 2020/0373168 | A1 | 11/2020 | Lee | |
| 2020/0381546 | A1 | 12/2020 | Cho et al. | |
| 2021/0098588 | A1 | 4/2021 | Chung et al. | |
| 2021/0193797 | A1 | 6/2021 | Xie et al. | |
| 2021/0210349 | A1 | 7/2021 | Xie et al. | |
| 2021/0351303 | A1 | 11/2021 | Ju et al. | |
| 2021/0375857 | A1 | 12/2021 | Huang et al. | |
| 2022/0037193 | A1 | 2/2022 | Yu et al. | |
| 2022/0093512 | A1 | 3/2022 | Chang et al. | |

FOREIGN PATENT DOCUMENTS

| | | | |
|---|---|---|---|
| JP | 2015536563 | A | 12/2015 |
| JP | 2021036590 | A | 3/2021 |
| TW | 478028 | B | 3/2002 |

OTHER PUBLICATIONS

PCT International Search Report and Written Opinion in PCT/US2022/080544 dated Apr. 11, 2023, 11 pages.

* cited by examiner

10

Provide Substrate — 12

Form Superlattice — 14

Nanosheet Patterning — 16

Form Shallow Trench Isolation (STI) — 18

Dummy Gate Patterning — 20

Spacer Formation — 22

Source/Drain Cavity Recess — 24

Bottom Dielectric Isolation Formation — 26

Inner Spacer Formation And Recess — 28

Amorphous Layer Deposition — 30

Directional Etch — 32

Amorphous Silicon Crystallization — 34

Source/Drain Epitaxy — 36

Nanosheet Release — 38

Replacement Metal Gate Formation — 40

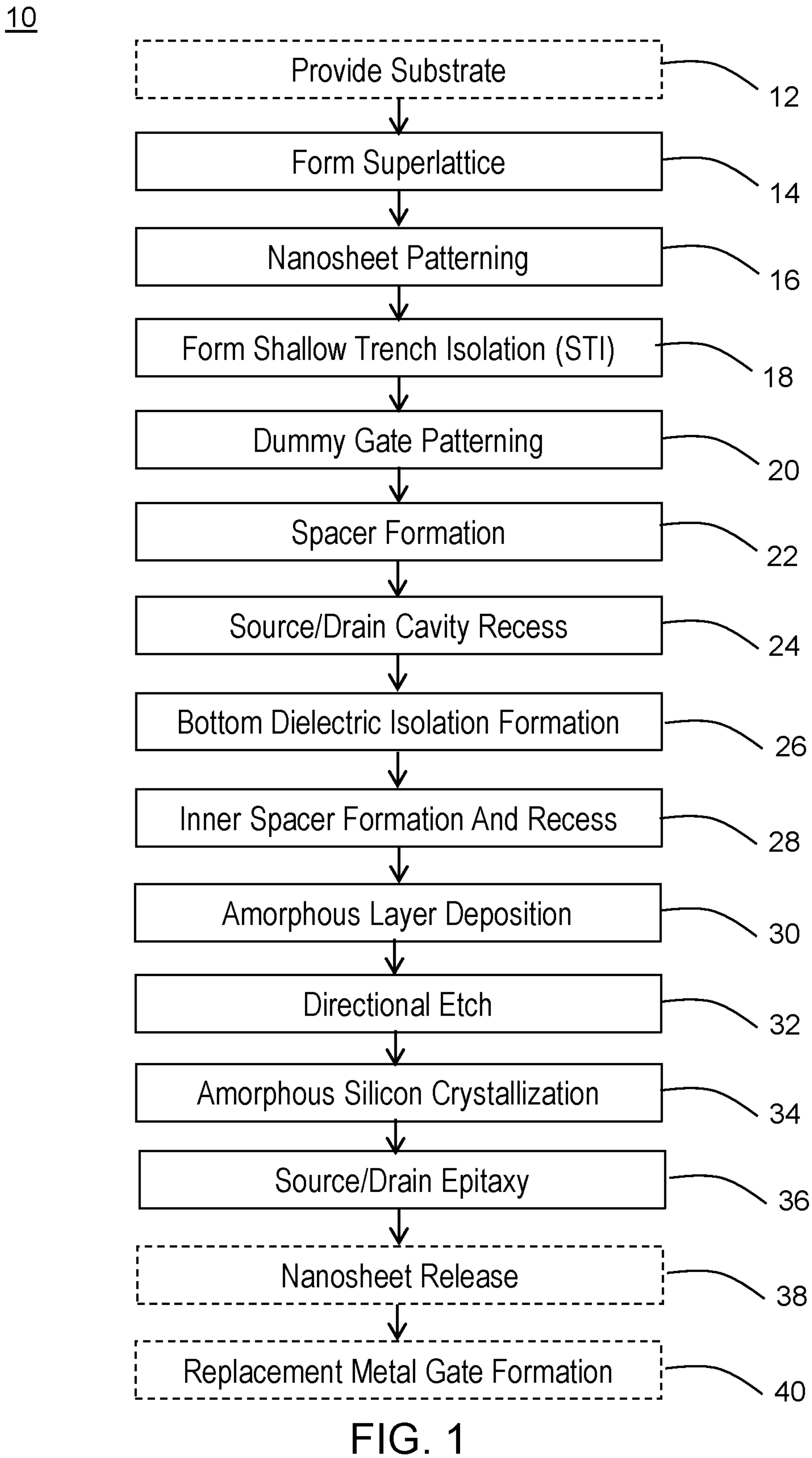

FIG. 1

SOURCE DRAIN FORMATION IN GATE ALL AROUND TRANSISTOR

CROSS-REFERENCE TO RELATED APPLICATIONS

This application claims priority to U.S. Provisional Application No. 63/238,270, filed Aug. 30, 2021, the entire disclosure of which is hereby incorporated by reference herein.

TECHNICAL FIELD

Embodiments of the disclosure generally relate to semiconductor devices. More particularly, embodiments of the disclosure are directed to gate all around (GAA) devices having a continuous sidewall silicon template.

BACKGROUND

The transistor is a key component of most integrated circuits. Since the drive current, and therefore speed, of a transistor is proportional to the gate width of the transistor, faster transistors generally require larger gate width. Thus, there is a trade-off between transistor size and speed, and "fin" field-effect transistors (finFETs) have been developed to address the conflicting goals of a transistor having maximum drive current and minimum size. FinFETs are characterized by a fin-shaped channel region that greatly increases the size of the transistor without significantly increasing the footprint of the transistor and are now being applied in many integrated circuits. However, finFETs have their own drawbacks.

As the feature sizes of transistor devices continue to shrink to achieve greater circuit density and higher performance, there is a need to improve transistor device structure to improve electrostatic coupling and reduce negative effects such as parasitic capacitance and off-state leakage. Examples of transistor device structures include a planar structure, a fin field effect transistor (FinFET) structure, and a horizontal gate all around (hGAA) structure. The hGAA device structure includes several lattice matched channels suspended in a stacked configuration and connected by source/drain regions. The hGAA structure provides good electrostatic control and can find broad adoption in complementary metal oxide semiconductor (CMOS) wafer manufacturing.

The presence of a bottom dielectric isolation layer is becoming a major performance enhancing layer for nanosheet devices. With a bottom dielectric isolation (BDI) layer underneath the source/drain, however, the epitaxial source/drain can only be grown from the sidewall and not from the bottom, resulting in numerous defects during growth/formation of the source and drain regions. Accordingly, there is a need for improved methods for forming gate-all-around devices.

SUMMARY

One or more embodiments of the disclosure are directed to methods of forming a semiconductor device. In one or more embodiments, a method of forming a semiconductor device comprises: forming a superlattice structure on a top surface of a substrate, the superlattice structure comprising a plurality of horizontal channel layers and a corresponding plurality of semiconductor material layers alternatingly arranged in a plurality of stacked pairs; patterning the superlattice structure to form a plurality of nanosheets separated by a trench; forming a shallow trench isolation (STI) layer in the trench; forming a dummy gate adjacent to the superlattice structure and on the STI layer; depositing a spacer layer on the dummy gate; forming a source trench and a drain trench adjacent to the superlattice structure; forming a bottom dielectric isolation layer in the source trench and the drain trench; forming an inner spacer on each of the plurality of semiconductor material layers; recessing the inner spacer to form a recessed region; depositing an amorphous layer in the recessed region and on the superlattice structure and on the dummy gate; etching the amorphous layer to expose the plurality of horizontal channel layers; crystallizing the amorphous layer; and forming a source region and a drain region.

Additional embodiments of the disclosure are directed to methods of forming a semiconductor device. In one or more embodiments, a method of forming a semiconductor device comprises: forming a source trench and a drain trench adjacent to a superlattice structure of a gate structure, the superlattice structure comprising a plurality of horizontal channel layers and a corresponding plurality of semiconductor material layers alternatingly arranged in a plurality of stacked pairs on a top surface of a substrate; forming a bottom dielectric isolation layer in the source trench and the drain trench; forming an inner spacer on each of the plurality of semiconductor material layers; recessing the inner spacer to form a recessed region; depositing a template material in the recessed region and on the superlattice structure and on the gate structure; crystallizing the template material; and forming a source region and a drain region.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 1 is a process flow diagram of a method according to one or more embodiments;

Figure 2A:
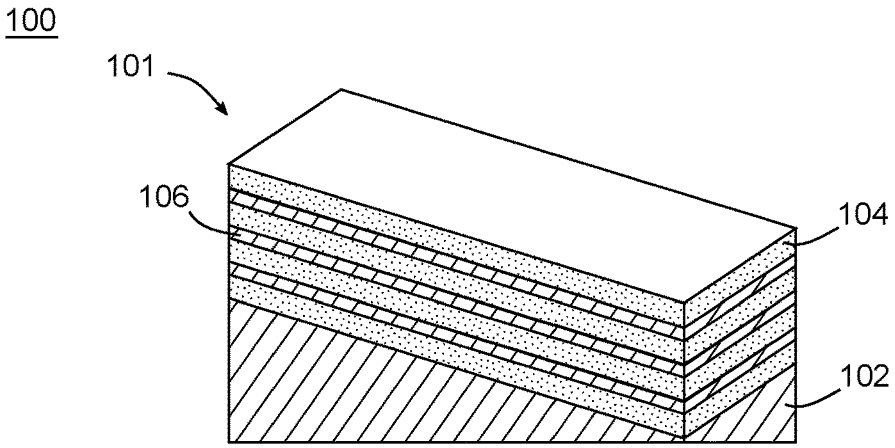
FIG. 2A illustrates a cross-section view of a device according to one or more embodiments.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate (or otherwise generate or graft target chemical moieties to impart chemical functionality), anneal and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus, for example, where a film/layer or partial film/layer has been deposited onto a substrate surface, the exposed surface of the newly deposited film/layer becomes the substrate surface. What a given substrate surface comprises will depend on what films are to be deposited, as well as the particular chemistry used.

As used in this specification and the appended claims, the terms "precursor," "reactant," "reactive gas" and the like are used interchangeably to refer to any gaseous species that can react with the substrate surface.

Transistors are circuit components or elements that are often formed on semiconductor devices. Depending upon the circuit design, in addition to capacitors, inductors, resistors, diodes, conductive lines, or other elements, transistors are formed on a semiconductor device. Generally, a transistor includes a gate formed between source and drain regions. In one or more embodiments, the source and drain regions include a doped region of a substrate and exhibit a doping profile suitable for a particular application. The gate is positioned over the channel region and includes a gate dielectric interposed between a gate electrode and the channel region in the substrate.

As used herein, the term "field effect transistor" or "FET" refers to a transistor that uses an electric field to control the electrical behavior of the device. Enhancement mode field effect transistors generally display very high input impedance at low temperatures. The conductivity between the drain and source terminals is controlled by an electric field in the device, which is generated by a voltage difference between the body and the gate of the device. The FET's three terminals are source(S), through which the carriers enter the channel; drain (D), through which the carriers leave the channel; and gate (G), the terminal that modulates the channel conductivity. Conventionally, current entering the channel at the source(S) is designated Is and current entering the channel at the drain (D) is designated $I_D$. Drain-to-source voltage is designated $V_{DS}$. By applying voltage to gate (G), the current entering the channel at the drain (i.e., $I_D$) can be controlled.

The metal-oxide-semiconductor field-effect transistor (MOSFET) is a type of field-effect transistor (FET). It has an insulated gate, whose voltage determines the conductivity of the device. This ability to change conductivity with the amount of applied voltage is used for amplifying or switching electronic signals. A MOSFET is based on the modulation of charge concentration by a metal-oxide-semiconductor (MOS) capacitance between a body electrode and a gate electrode located above the body and insulated from all other device regions by a gate dielectric layer. Compared to the MOS capacitor, the MOSFET includes two additional terminals (source and drain), each connected to individual highly doped regions that are separated by the body region. These regions can be either p or n type, but they are both be of the same type, and of opposite type to the body region. The source and drain (unlike the body) are highly doped as signified by a "+" sign after the type of doping.

If the MOSFET is an n-channel or nMOS FET, then the source and drain are n+ regions and the body is a p region. If the MOSFET is a p-channel or pMOS FET, then the source and drain are p+ regions and the body is an n region. The source is so named because it is the source of the charge carriers (electrons for n-channel, holes for p-channel) that flow through the channel; similarly, the drain is where the charge carriers leave the channel.

As used herein, the term "fin field-effect transistor (FinFET)" refers to a MOSFET transistor built on a substrate where the gate is placed on two or three sides of the channel, forming a double- or triple-gate structure. FinFET devices have been given the generic name FinFETs because the channel region forms a "fin" on the substrate. FinFET devices have fast switching times and high current density.

As used herein, the term "gate all-around (GAA)," is used to refer to an electronic device, e.g., a transistor, in which the gate material surrounds the channel region on all sides. The channel region of a GAA transistor may include nanowires or nano-slabs, or nano-sheets, bar-shaped channels, or other suitable channel configurations known to one of skill in the art. In one or more embodiments, the channel region of a GAA device has multiple horizontal nanowires or horizontal bars vertically spaced, making the GAA transistor a stacked horizontal gate-all-around (hGAA) transistor.

As used herein, the term "nanowire" refers to a nanostructure, with a diameter on the order of a nanometer ($10^{-9}$ meters). Nanowires can also be defined as the ratio of the length to width being greater than 1000. Alternatively, nanowires can be defined as structures having a thickness or diameter constrained to tens of nanometers or less and an unconstrained length. Nanowires are used in transistors and some laser applications, and, in one or more embodiments, are made of semiconducting materials, metallic materials, insulating materials, superconducting materials, or molecular materials. In one or more embodiments, nanowires are used in transistors for logic CPU, GPU, MPU, and volatile (e.g., DRAM) and non-volatile (e.g., NAND) devices. As used herein, the term "nanosheet" refers to a two-dimensional nanostructure with a thickness in a scale ranging from about 0.1 nm to about 1000 nm.

The embodiments of the disclosure are described by way of the Figures, which illustrate devices (e.g., transistors) and processes for forming transistors in accordance with one or more embodiments of the disclosure. The processes shown are merely illustrative possible uses for the disclosed processes, and the skilled artisan will recognize that the disclosed processes are not limited to the illustrated applications.

One or more embodiments of the disclosure are described with reference to the Figures. In the method of one or more embodiments, gate all-around transistors with a bottom dielectric isolation (BDI) layer are fabricated using a standard process flow. After the bottom dielectric isolation (BDI) layer is formed, the inner spacer is laterally etched, an amorphous template material is deposited, the template material is then etched and crystallized, and the source/drain is formed. The crystallized template material advantageously permits epitaxial growth on the bottom of the source/drain trench as well as on the sidewall. In one or more embodiments, implementing a continuous sidewall amorphous silicon template advantageously eliminates the need of bottom silicon template. Thus, BDI can be used for providing device-to-device isolation and eliminating the need for higher sub-fin doping. In this way, the approach does not degrade the channel mobility due to coulomb scattering and does not degrade the variability performance due to random dopant distribution (RDD).

In some embodiments, the amorphous template material is deposited on one or more of the bottom surface of the source/drain trench and the sidewall of the source/drain trench. In some embodiments, the amorphous template material is deposited conformally. As used herein, the term "conformal" means that the layer adapts to the contours of a feature or a layer. Conformality of a layer is typically quantified by a ratio of the average thickness of a layer deposited on the sidewalls of a feature to the average thickness of the same deposited layer on the field, or upper surface, of the substrate. In one or more embodiments, the amorphous template material is crystallized by rapid thermal processing (RTP), or laser anneal. Forming the source region and the drain region comprises growing an epitaxial layer.

FIG. 1 illustrates a process flow diagram for a method 10 for forming a semiconductor device in accordance with some embodiments of the present disclosure. FIGS. 2A-2N depict the stages of fabrication of semiconductor structures in accordance with some embodiments of the present disclosure. The method 10 is described below with respect to FIGS. 2A-2N. FIGS. 2A-2N are cross-sectional views of an electronic device (e.g., a GAA) according to one or more embodiments. The method 10 may be part of a multi-step fabrication process of a semiconductor device. Accordingly, the method 10 may be performed in any suitable process chamber coupled to a cluster tool. The cluster tool may include process chambers for fabricating a semiconductor device, such as chambers configured for etching, deposition, physical vapor deposition (PVD), chemical vapor deposition (CVD), oxidation, or any other suitable chamber used for the fabrication of a semiconductor device.

FIGS. 2A-2N are the fabrication steps of operations 12 thru 36 in FIG. 1. Referring to FIG. 1, the method 10 of forming the device 100 begins at operation 12, by providing a substrate 102. In some embodiments, the substrate 102 may be a bulk semiconductor substrate. As used herein, the term "bulk semiconductor substrate" refers to a substrate in which the entirety of the substrate is comprised of a semiconductor material. The bulk semiconductor substrate may comprise any suitable semiconducting material and/or combinations of semiconducting materials for forming a semiconductor structure. For example, the semiconducting layer may comprise one or more materials such as crystalline silicon (e.g., Si<100> or Si<111>), silicon oxide, strained silicon, silicon germanium, doped or undoped polysilicon, doped or undoped silicon wafers, patterned or non-patterned wafers, doped silicon, germanium, gallium arsenide, or other suitable semiconducting materials. In some embodiments, the semiconductor material is silicon (Si). In one or more embodiments, the semiconductor substrate 102 comprises a semiconductor material, e.g., silicon (Si), carbon (C), germanium (Ge), silicon germanium (SiGe), germanium tin (GeSn), other semiconductor materials, or any combination thereof. In one or more embodiments, the substrate 102 comprises one or more of silicon (Si), germanium (Ge), gallium (Ga), arsenic (As), or phosphorus (P). Although a few examples of materials from which the substrate may be formed are described herein, any material that may serve as a foundation upon which passive and active electronic devices (e.g., transistors, memories, capacitors, inductors, resistors, switches, integrated circuits, amplifiers, optoelectronic devices, or any other electronic devices) may be built falls within the spirit and scope of the present disclosure.

In some embodiments, the semiconductor material may be a doped material, such as n-doped silicon (n-Si), or p-doped silicon (p-Si). In some embodiments, the substrate may be doped using any suitable process such as an ion implantation process. As used herein, the term "n-type" refers to semiconductors that are created by doping an intrinsic semiconductor with an electron donor element during manufacture. The term n-type comes from the negative charge of the electron. In n-type semiconductors, electrons are the majority carriers and holes are the minority carriers. As used herein, the term "p-type" refers to the positive charge of a well (or hole). As opposed to n-type semiconductors, p-type semiconductors have a larger hole concentration than electron concentration. In p-type semiconductors, holes are the majority carriers and electrons are the minority carriers. In one or more embodiments, the dopant is selected from one or more of boron (B), gallium (Ga), phosphorus (P), arsenic (As), other semiconductor dopants, or combinations thereof.

Referring to FIG. 1 and FIG. 2A, in one or more embodiments, at operation 14, at least one superlattice structure 101 is formed atop the top surface of the substrate 102. The superlattice structure 101 comprises a plurality of semiconductor material layers 106 and a corresponding plurality of horizontal channel layers 104 alternatingly arranged in a plurality of stacked pairs. In some embodiments the plurality of stacked groups of layers comprises a silicon (Si) and silicon germanium (SiGe) group. In some embodiments, the plurality of semiconductor material layers 106 comprise silicon germanium (SiGe), and the plurality of horizontal channel layers 104 comprise silicon (Si). In other embodiments, the plurality of horizontal channel layers 104 comprise silicon germanium (SiGe), and the plurality of semiconductor materials layers 106 comprise silicon (Si).

In some embodiments, the plurality of semiconductor material layers 106 and corresponding plurality of horizontal channel layers 104 can comprise any number of lattice matched material pairs suitable for forming a superlattice structure 204. In some embodiments, the plurality of semiconductor material layers 106 and corresponding plurality of horizontal channel layers 104 comprise from about 2 to about 50 pairs of lattice matched materials.

In one or more embodiments, the thickness of the plurality of semiconductor material layers 106 and the plurality of horizontal channel layers 104 are in the range of from about 2 nm to about 50 nm, in the range of from about 3 nm to about 20 nm, or in a range of from about 2 nm to about 15 nm.

Figure 2B:
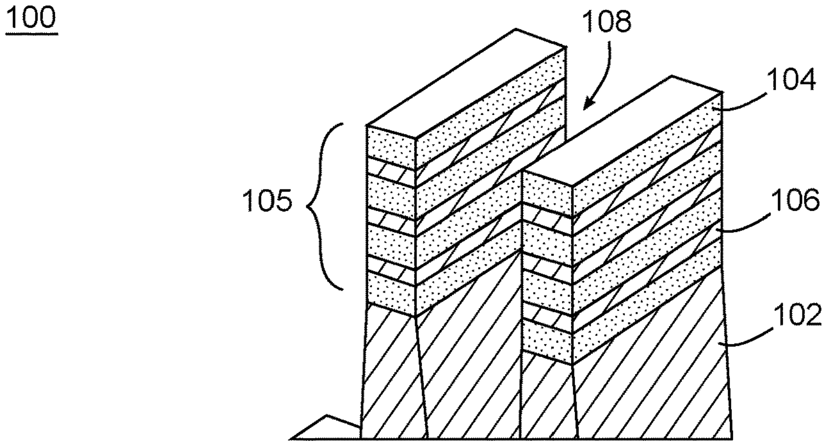
FIG. 2B illustrates a cross-section view of a device according to one or more embodiments.

With reference to FIG. 1 and FIG. 2B, in one or more embodiments, at operation 16, the superlattice structure 101 is patterned to form an opening 108 between adjacent stacks 105. The patterning may be done by any suitable means known to the skilled artisan. As used in this regard, the term "opening" means any intentional surface irregularity. Suitable examples of openings include, but are not limited to, trenches which have a top, two sidewalls and a bottom. Openings can have any suitable aspect ratio (ratio of the depth of the feature to the width of the feature). In some embodiments, the aspect ratio is greater than or equal to about 5:1, about 10:1, about 15:1, about 20:1, about 25:1, about 30:1, about 35:1 or about 40:1.

Figure 2C:
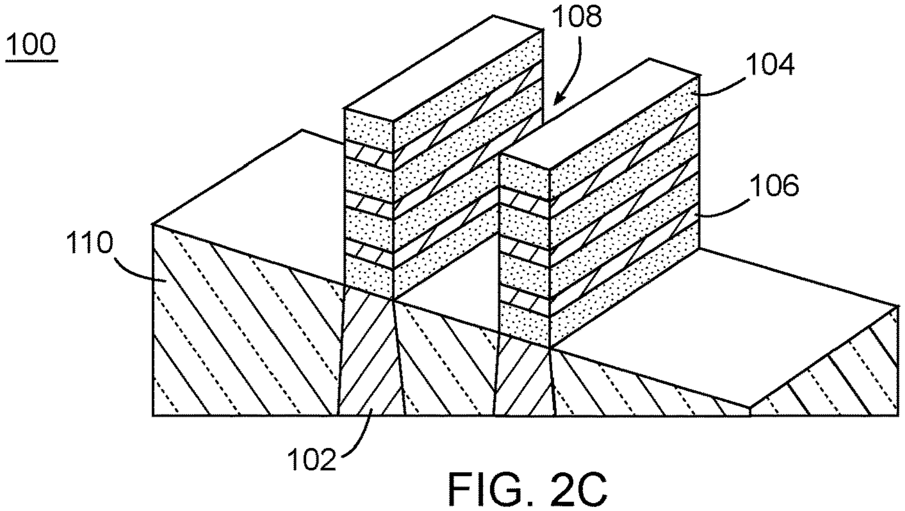
FIG. 2C illustrates a cross-section view of a device according to one or more embodiments.

Referring to FIG. 1 and FIG. 2C, at operation 18, a shallow trench isolation (STI) 110 is formed. As used herein, the term "shallow trench isolation (STI)" refers to an integrated circuit feature which prevents current leakage. In one or more embodiments, STI is created by depositing one or more dielectric materials (such as silicon dioxide) to fill the trench or opening 108 and removing the excess dielectric using a technique such as chemical-mechanical planarization.

Figure 2D:
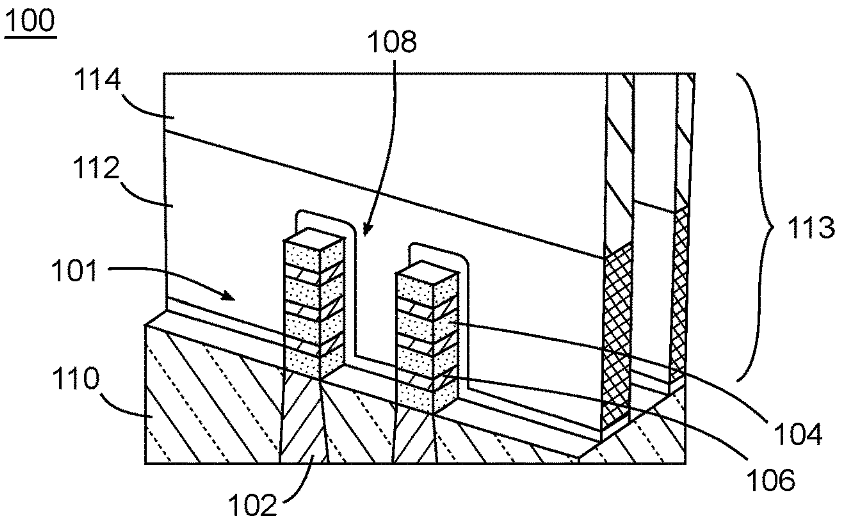
FIG. 2D illustrates a cross-section view of a device according to one or more embodiments.

With reference to FIG. 1 and FIG. 2D, in some embodiments, a replacement gate structure 113 (e.g., a dummy gate structure) is formed over and adjacent to the superlattice structure 101. The dummy gate structure 113 defines the channel region of the transistor device. The dummy gate structure 113 may be formed using any suitable conventional deposition and patterning process known in the art.

In one or more embodiments, the dummy gate structure comprises one or more of a gate 114 and a poly-silicon layer 112. In one or more embodiments, the dummy gate structure comprises one or more of tungsten (W), cobalt (Co), molybdenum (Mo), ruthenium (Ru), titanium nitride (TiN), tantalum nitride (TaN), titanium aluminum (TiAl), and N doped polysilicon.

Figure 2E:
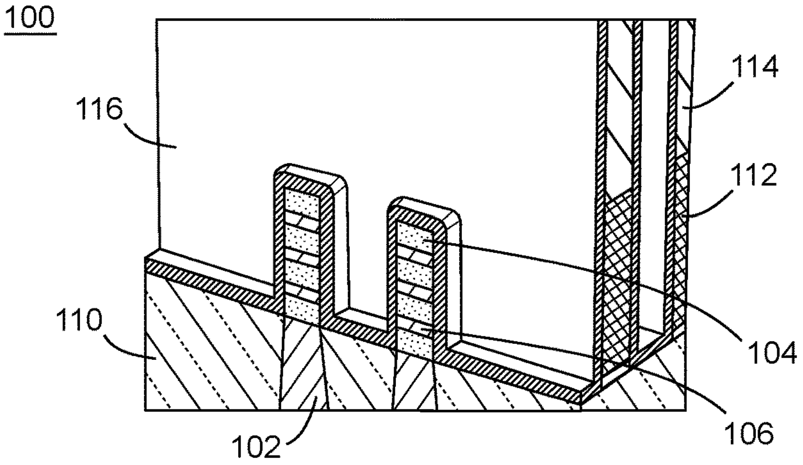
FIG. 2E illustrates a cross-section view of a device according to one or more embodiments.

Referring to FIG. 1 and FIG. 2E, in some embodiments, at operation 22, sidewall spacers 116 are formed along outer sidewalls of the dummy gate structure 113 an on the superlattice structure 101. The sidewall spacers 116 may comprise any suitable insulating materials known in the art, for example, silicon nitride, silicon oxide, silicon oxynitride, silicon carbide, or the like. In some embodiments, the sidewall spacers are formed using any suitable conventional deposition and patterning process known in the art, such as atomic layer deposition, plasma enhanced atomic layer deposition, plasma enhanced chemical vapor deposition, low-pressure chemical vapor deposition, or isotropic deposition.

Figure 2F:
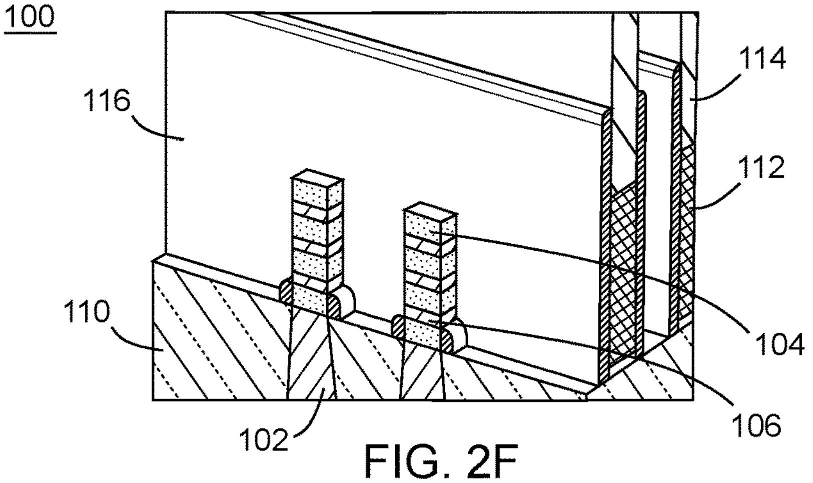
FIG. 2F illustrates a cross-section view of a device according to one or more embodiments.

With reference to FIG. 2F, the spacer 116 is etched away to expose the superlattice structure 101. A channel region 108 separates the superlattice structure 101 from an adjacent superlattice structure 101. The spacers 116 may be removed from the superlattice structure 101 by any suitable means known to the skilled artisan.

Figure 2G:
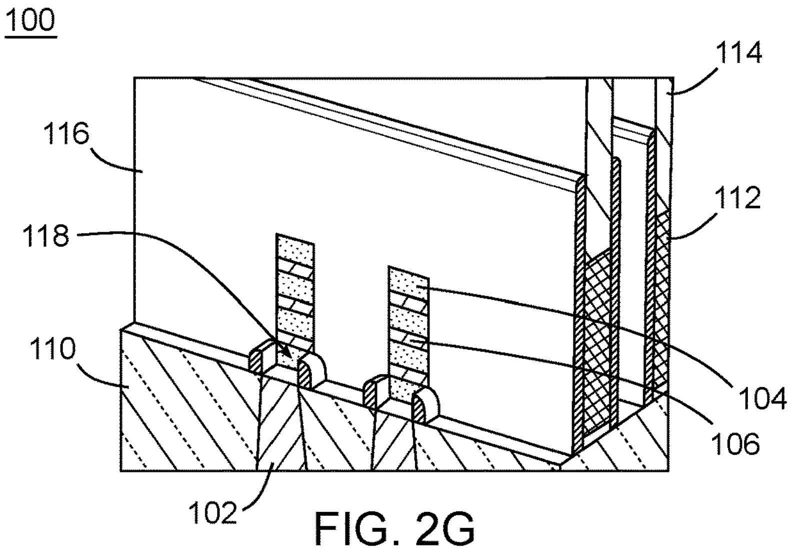
FIG. 2G illustrates a cross-section view of a device according to one or more embodiments.

Referring to FIG. 1 and FIG. 2G, at operation 24, in one or more embodiments, a source/drain trenches 118 are formed adjacent (i.e., on either side) the superlattice structure 101.

Figure 2H:
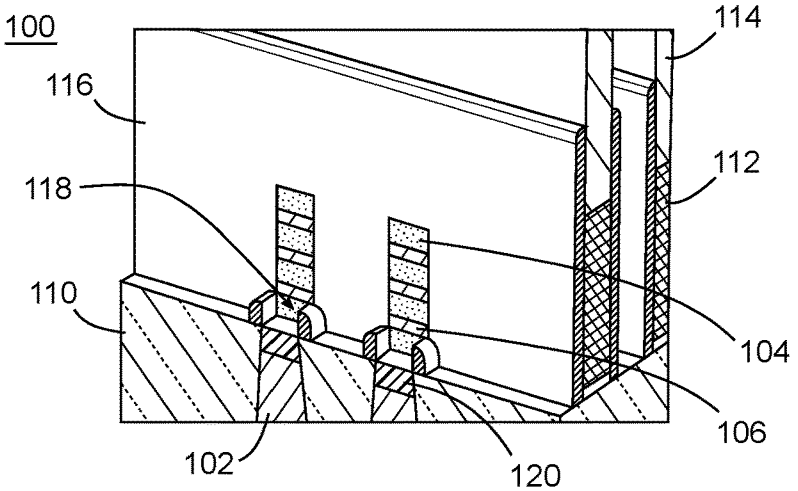
FIG. 2H illustrates a cross-section view of a device according to one or more embodiments.

With reference to FIG. 1 and FIG. 2H, at operation 26, in one or more embodiments, a bottom dielectric isolation (BDI) layer 120 may be formed on the substrate 102. The bottom dielectric isolation (BDI) layer 120 may comprise any suitable material known to the skilled artisan. In one or more embodiments, the bottom dielectric isolation (BDI) layer 120 comprises one or more of silicon oxide ($SiO_x$), silicon nitride (SiN), silicon carbide (SiC), or a high-K material. In some embodiments, the high-K material is selected from one or more of aluminum oxide ($Al_2O_3$), hafnium oxide ($HfO_2$), and the like. In one or more specific embodiments, the bottom dielectric isolation (BDI) layer 120 comprises silicon oxide.

In some embodiments, bottom dielectric isolation (BDI) layer 120 is deposited on the substrate 102 using conventional chemical vapor deposition methods. In some embodiments, the bottom dielectric isolation (BDI) layer 120 is recessed below the top surface of the substrate 102 so that the bottom portion of the superlattice structure 101 is formed from the substrate 102.

Figure 2I:
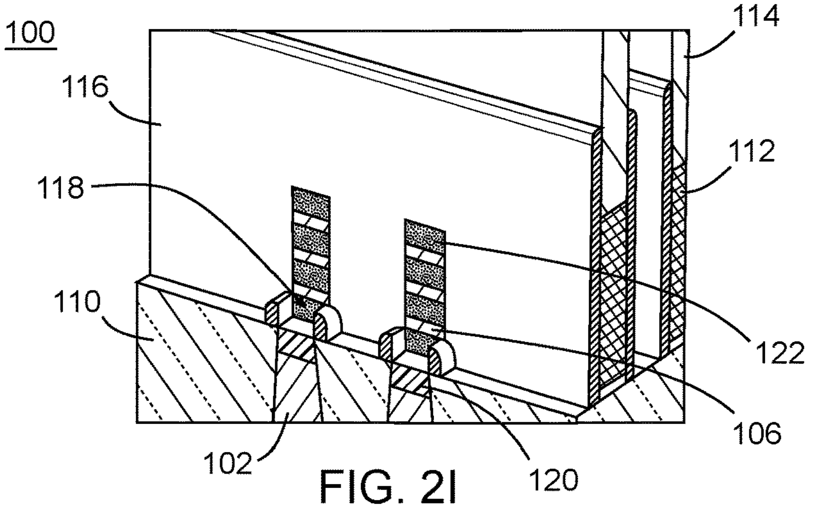
FIG. 2I illustrates a cross-section view of a device according to one or more embodiments.

Referring to FIG. 1 and FIG. 2I, at operation 28, an inner spacer layer 122 is formed on each of the horizontal channel layers 104. The inner spacer layer 122 may comprise any suitable material known to the skilled artisan. In one or more embodiments, the inner spacer layer 122 comprises a nitride material. In specific embodiments, the inner spacer layer 122 comprises silicon nitride.

Figure 2J:
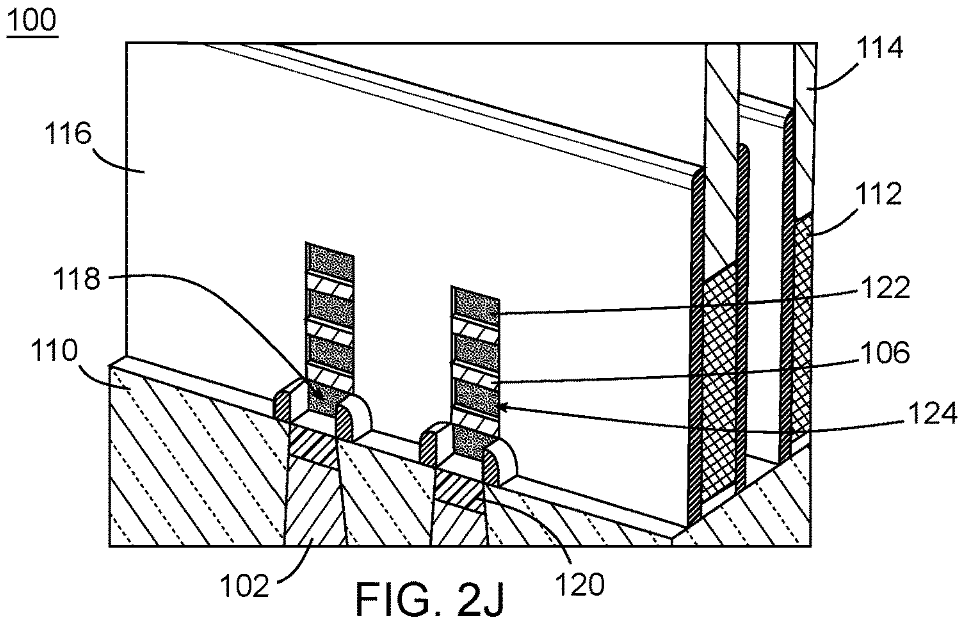
FIG. 2J illustrates a cross-section view of a device according to one or more embodiments.

As depicted in FIG. 2J, at operation 28, the inner spacer layer 122 is recessed to form a recessed region 124. In one or more embodiments, when the inner spacer layer 122 is recessed, the horizontal channel layers 104 extend beyond the inner spacer layer 122.

Figure 2K:
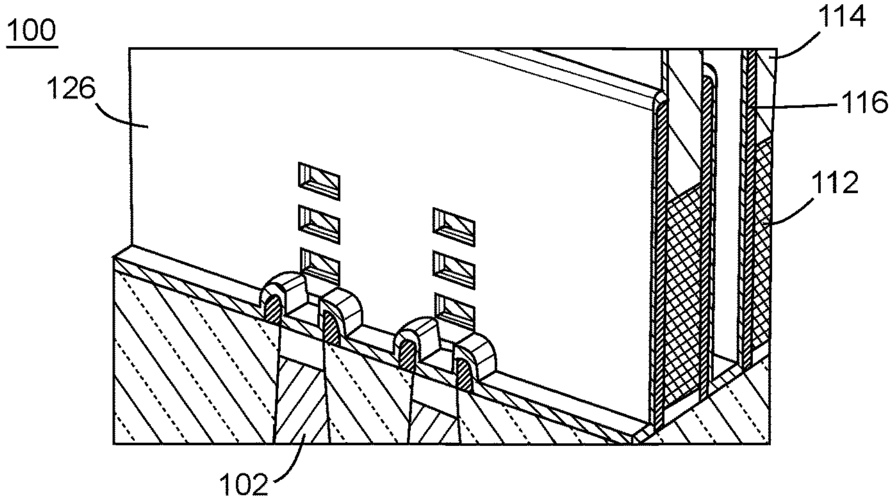
FIG. 2K illustrates a cross-section view of a device according to one or more embodiments.

Referring to FIG. 2K and to FIG. 1, at operation 30, an amorphous template material 126 is deposited in the channel region 108 and onto the bottom surface of the source/drain trenches 118 and over the dummy gate structure 113. The amorphous template material 126 may comprise any suitable material known to the skilled artisan. In some embodiments, the amorphous template material 126 is amorphous. In one or more embodiments, the template material comprises one or more of silicon (Si), silicon germanium (SiGe), titanium (Ti), zirconium (Zr), and hafnium (Hf). In one or more embodiments, the amorphous template material 126 comprises one or more of silicon (Si), germanium (Ge), and silicon germanium (SiGe).

The amorphous template material 126 can be deposited using any suitable conventional deposition process known in the art, such as atomic layer deposition, plasma enhanced atomic layer deposition, plasma enhanced chemical vapor deposition, or low-pressure chemical vapor deposition.

In one or more embodiments, the thickness of the amorphous template material 126 is in the range of from about 2 nm to about 50 nm, in the range of from about 3 nm to about 20 nm, or in a range of from about 2 nm to about 15 nm.

In some embodiments, the amorphous template material 126 may be deposited in the channel region 108 and onto the bottom surface of the source/drain trenches 118 and on the sidewalls of the superlattice structure 101.

Figure 2L:
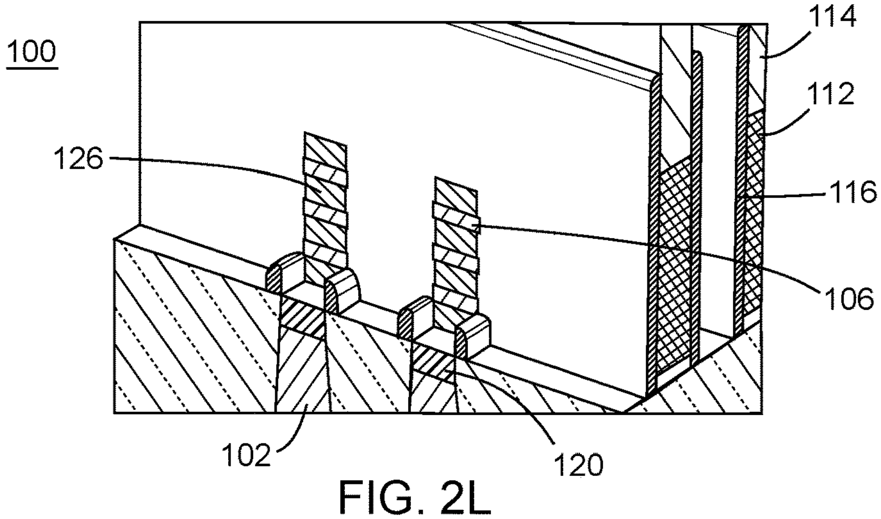
FIG. 2L illustrates a cross-section view of a device according to one or more embodiments.

At operation 32, as illustrated in FIG. 2L, the amorphous template material 126 is removed exposing the spacers 116 and the horizontal channel layers 104. The amorphous template material 126 may be removed using any suitable means known to the skilled artisan. In one or more embodiments, the amorphous template material 126 is removed by directional etching. In one or more embodiments, the amorphous template material 126 remains on inner spacer layer 122 in the recessed region 124.

The etch process of operation 32 may include any suitable etch process that is selective to the spacer material 116. In some embodiments the etch process of operation 32 comprises one or more of a wet etch process or a dry etch process.

In some embodiments, the dry etch process may include a conventional plasma etch, or a remote plasma-assisted dry etch process. In a conventional plasma etch, or in a remote plasma-assisted dry etch process, the device is exposed to $H_2$, $NF_3$, and/or $NH_3$ plasma species, e.g., plasma-excited hydrogen and fluorine species. For example, in some embodiments, the device may undergo simultaneous exposure to $H_2$, $NF_3$, and $NH_3$ plasma. The conventional plasma etch or remote plasma-assisted dry etch process may be performed in any suitable chamber, which may be integrated into one of a variety of multi-processing platforms. The wet etch process may include a hydrofluoric (HF) acid last process, i.e., the so-called "HF last" process, in which HF etching of surface is performed that leaves surface hydrogen-terminated. Alternatively, any other liquid-based pre-epitaxial pre-clean process may be employed. In some embodiments, the process comprises a sublimation etch for native oxide removal. The etch process can be plasma or thermally based. The plasma processes can be any suitable plasma (e.g., conductively coupled plasma, inductively coupled plasma, microwave plasma).

Figure 2M:
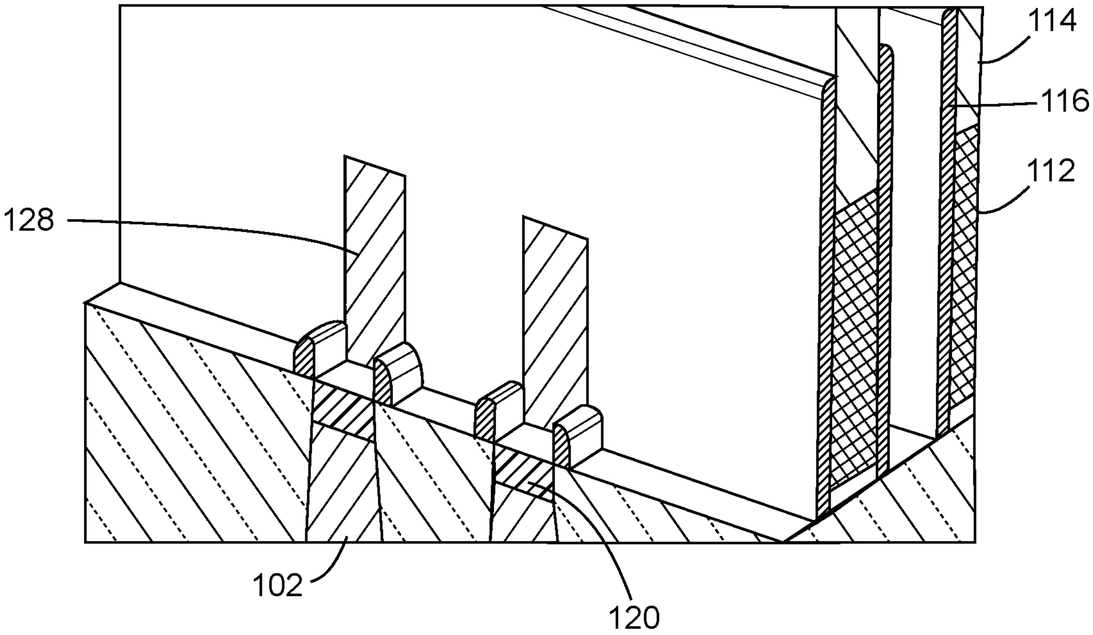
FIG. 2M illustrates a cross-section view of a device according to one or more embodiments.
Figure 2N:
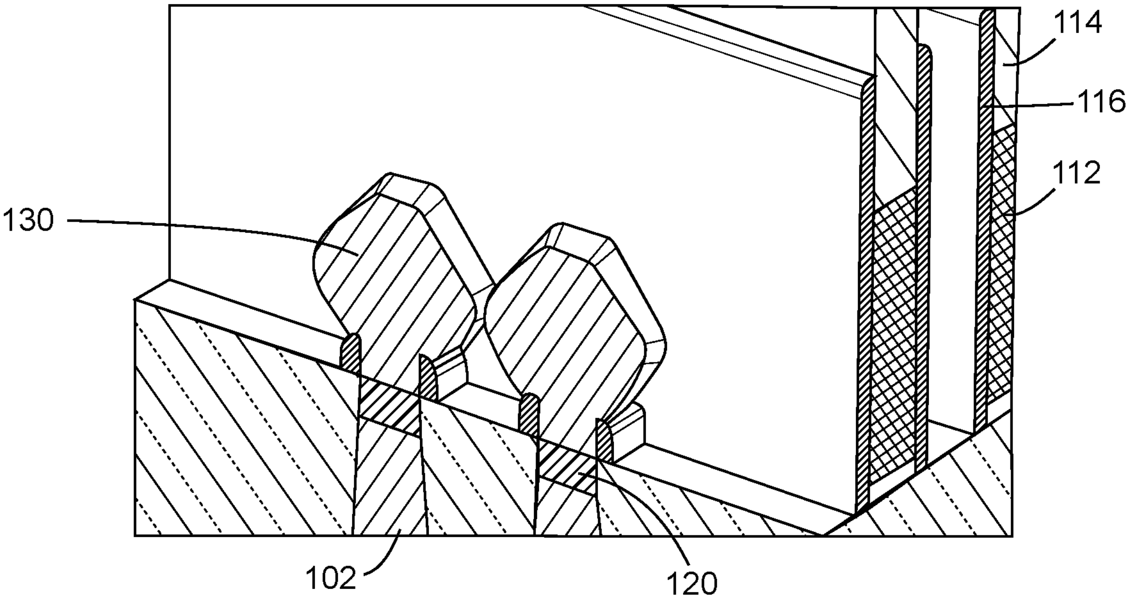
FIG. 2N illustrates a cross-section view of a device according to one or more embodiments.

Referring to FIG. 1 and FIG. 2M, at operation 34, the amorphous template material 126 is crystallized to form a crystalline template material 128.

The amorphous template material 126 may be crystallized by any suitable means known to the skilled artisan. In one or more embodiments, the amorphous template material 126 is crystallized by rapid thermal processing (RTP) or laser anneal.

In some embodiments, the rapid thermal processing (RTP) or laser anneal is conducted at a temperature in a range of from 500° C. to 900° C., or in a range of from 600° C. to 900° C., or in a range of from 600° C. to 800° C. In some embodiments, the rapid thermal processing (RTP) or laser anneal is conducted at a pressure in a range of from 5 Torr to 20 Torr. In one or more embodiments, the rapid thermal processing or laser annealing is conducted in an atmosphere of hydrogen ($H_2$) gas and oxygen ($O_2$) gas at ambient pressure.

Referring to FIG. 1 and FIG. 2N, at operation 36, in some embodiments, the embedded source/drain regions 130 form in a source/drain trench 118. In some embodiments, the source region 130 is formed adjacent a first end of the superlattice structure 101 and the drain region 130 is formed adjacent a second, opposing end of the superlattice structure 101. In some embodiments, the source region and/or drain region 130 are formed from any suitable semiconductor material, such as but not limited to silicon (Si), germanium (Ge), silicon germanium (SiGe), silicon phosphorous (SiP), silicon arsenic (SiAs), or the like. In some embodiments, the source/drain regions 130 may be formed using any suitable deposition process, such as an epitaxial deposition process. In some embodiments, the source/drain regions 130 are independently doped with one or more of phosphorus (P), arsenic (As), boron (B), and gallium (Ga).

In some embodiments, an inter-layer dielectric (ILD) layer (not illustrated) is blanket deposited over the substrate 102, including the source/drain regions 130, the dummy gate structure 113, and the sidewall spacers 116. The ILD layer may be deposited using a conventional chemical vapor deposition method (e.g., plasma enhance chemical vapor deposition and low-pressure chemical vapor deposition). In one or more embodiments, ILD layer is formed from any suitable dielectric material such as, but not limited to, undoped silicon oxide, doped silicon oxide (e.g., BPSG, PSG), silicon nitride, and silicon oxynitride. In one or more embodiments, ILD layer is then polished back using a conventional chemical mechanical planarization method to expose the top of the dummy gate structure 113. In some embodiments, the ILD layer is polished to expose the top of the dummy gate structure 113 and the top of the sidewall spacers 116.

The dummy gate structure 101 may be removed to expose the channel region 108 of the superlattice structure 101. The ILD layer protects the source/drain regions 130 during the removal of the dummy gate structure 113. The dummy gate structure 113 may be removed using any conventional etching method such as a plasma dry etch or a wet etch. In some embodiments, the dummy gate structure 113 comprises polysilicon and the dummy gate structure 113 is removed by a selective etch process. In some embodiments, the dummy gate structure 113 comprises polysilicon and the superlattice structure 101 comprises alternating layers of silicon (Si) and silicon germanium (SiGe).

Referring to FIG. 1, at operations 38 and 40, the formation of the semiconductor device, e.g., GAA, continues according to traditional procedures with nanosheet release and replacement metal gate formation. Specifically, in one or more unillustrated embodiments, the plurality of semiconductor material layers 106 are selectively etched between the plurality of horizontal channel layers 104 in the superlattice structure 101. For example, where the superlattice structure 101 is composed of silicon (Si) layers and silicon germanium (SiGe) layers, the silicon germanium (SiGe) is selectively etched to form channel nanowires. The plurality of semiconductor material layers 106, for example silicon germanium (SiGe), may be removed using any well-known etchant that is selective to the plurality of horizontal channel layers 104 where the etchant etches the plurality of semiconductor material layers 106 at a significantly higher rate than the plurality of horizontal channel layers 104. In some embodiments, a selective dry etch or wet etch process may be used. In some embodiments, where the plurality of horizontal channel layers 104 are silicon (Si) and the plurality of semiconductor material layers 106 are silicon germanium (SiGe), the layers of silicon germanium may be selectively removed using a wet etchant such as, but not limited to aqueous carboxylic acid/nitric acid/HF solution and aqueous citric acid/nitric acid/HF solution. The removal of the plurality of semiconductor material layers 106 leaves voids between the plurality of horizontal channel layers 104. The voids between the plurality of horizontal channel layers 104 have a thickness of about 3 nm to about 20 nm. The remaining horizontal channel layers 104 form a vertical array of channel nanowires that are coupled to the source/drain regions 130. The channel nanowires run parallel to the top surface of the substrate 102 and are aligned with each other to form a single column of channel nanowires.

In one or more embodiments, operation 40 of method 10 represents one or more post-processing operations. The one or more post-processes can by any of the processes known to the skilled artisan for completion of the device, e.g., replacement metal gate formation. For example, in one or more unillustrated embodiments, a high-k dielectric is formed. The high-k dielectric can be any suitable high-k dielectric material deposited by any suitable deposition technique known to the skilled artisan. The high-k dielectric of some embodiments comprises hafnium oxide. In some embodiments, a conductive material such as titanium nitride (TiN), tungsten (W), cobalt (Co), aluminum (Al), or the like is deposited on the high-k dielectric. The conductive material may be formed using any suitable deposition process such as, but not limited to, atomic layer deposition (ALD) in order to ensure the formation of a layer having a uniform thickness around each of the plurality of channel layers.

In some embodiments, the method 10 is integrated such that there is no vacuum break. In one or more embodiments, the deposition of the template material (operation 30), the direction etching of the template material (operation 32) the crystallization of the template material (operation 34), and the source/drain epitaxial growth (operation 36), can be integrated such that there is no vacuum break between the operations.

In some embodiments, the apparatus or process tool is configured to maintain the substrate under vacuum conditions to prevent formation of an oxide layer after the deposition of the amorphous template material 126. In embodiments of this sort, the process tool is configured to move the substrate from a surface treatment chamber (e.g., an annealing chamber) to a rapid thermal processing (RTP) chamber for operation 34 (i.e., crystallization) without exposing the substrate to atmospheric conditions.

One or more embodiments of the disclosure are directed to methods of forming a semiconductor device. In one or more embodiments, a method of forming a semiconductor device, comprises: forming a superlattice structure on a top surface of a substrate, the superlattice structure comprising a plurality of horizontal channel layers and a corresponding plurality of semiconductor material layers alternatingly arranged in a plurality of stacked pairs; patterning the superlattice structure to form a plurality of nanosheets separated by a trench; forming a shallow trench isolation (STI) layer in the trench; forming a dummy gate adjacent to the superlattice structure and on the STI layer; depositing a spacer layer on the dummy gate; forming a source trench and a drain trench adjacent to the superlattice structure; forming a bottom dielectric isolation layer in the source trench and the drain trench; forming an inner spacer on each of the plurality of semiconductor material layers; recessing the inner spacer to form a recessed region; depositing an amorphous layer in the recessed region and on the superlattice structure and on the dummy gate; etching the amorphous layer to expose the plurality of horizontal channel layers; crystallizing the amorphous layer; and forming a source region and a drain region.

Figure 3:
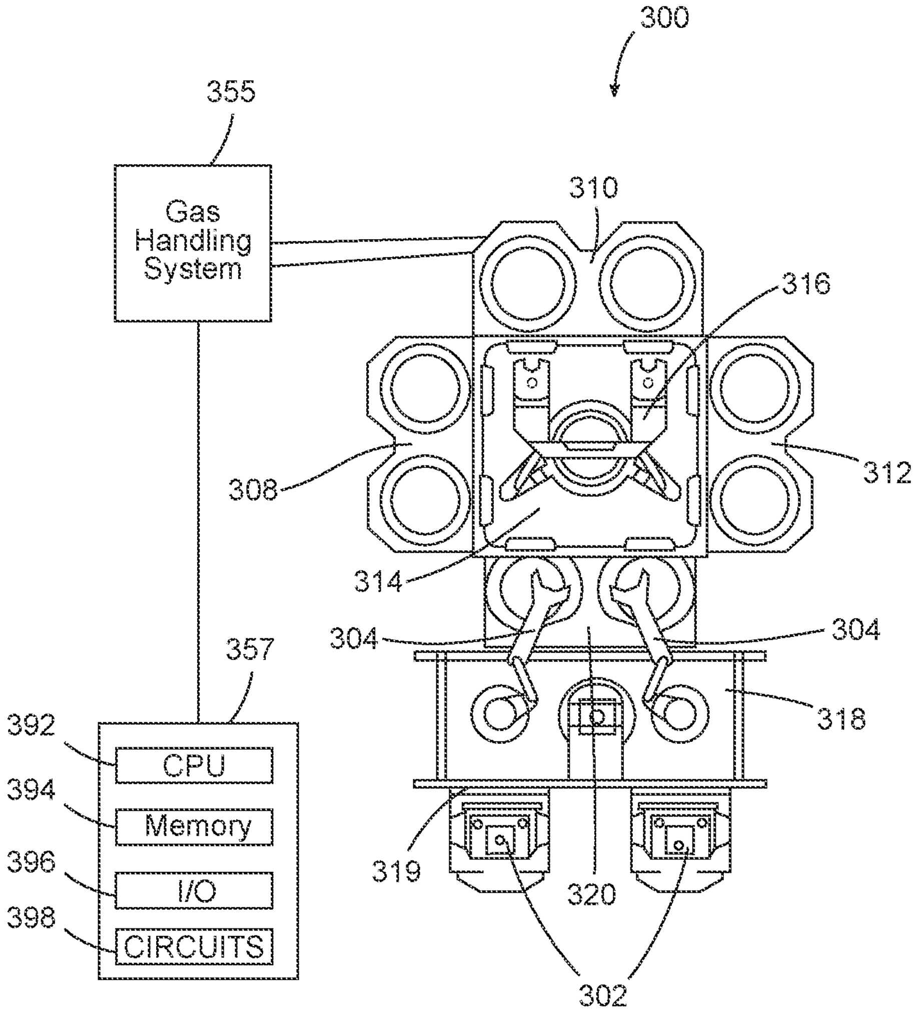
FIG. 3 illustrates a cluster tool according to one or more embodiments.

Additional embodiments of the disclosure are directed to processing tools 300 for the formation of the GAA devices and methods described, as shown in FIG. 3. A variety of multi-processing platforms may be utilized. The cluster tool 300 includes at least one central transfer station 314 with a plurality of sides. A robot 316 is positioned within the central transfer station 314 and is configured to move a robot blade and a wafer to each of the plurality of sides.

The cluster tool 300 comprises a plurality of processing chambers 308, 310, and 312, also referred to as process stations, connected to the central transfer station. The various processing chambers provide separate processing regions isolated from adjacent process stations. The processing chamber can be any suitable chamber including, but not limited to, a pre-clean chamber, a deposition chamber, an annealing chamber (i.e., a template crystallizing chamber), an etching chamber, and the like. The particular arrangement of process chambers and components can be varied depending on the cluster tool and should not be taken as limiting the scope of the disclosure.

In the embodiment shown in FIG. 3, a factory interface 318 is connected to a front of the cluster tool 300. The factory interface 318 includes chambers 302 for loading and unloading on a front 319 of the factory interface 318.

The size and shape of the loading chamber and unloading chamber 302 can vary depending on, for example, the substrates being processed in the cluster tool 300. In the embodiment shown, the loading chamber and unloading chamber 302 are sized to hold a wafer cassette with a plurality of wafers positioned within the cassette.

Robots 304 are within the factory interface 318 and can move between the loading and unloading chambers 302. The robots 304 are capable of transferring a wafer from a cassette in the loading chamber 302 through the factory interface 318 to load lock chamber 320. The robots 304 are also capable of transferring a wafer from the load lock chamber 320 through the factory interface 318 to a cassette in the unloading chamber 302.

The robot 316 of some embodiments is a multi-arm robot capable of independently moving more than one wafer at a time. The robot 316 is configured to move wafers between the chambers around the transfer chamber 314. Individual wafers are carried upon a wafer transport blade that is located at a distal end of the first robotic mechanism.

A system controller 357 is in communication with the robot 316, and a plurality of processing chambers 308, 310 and 312. The system controller 357 can be any suitable component that can control the processing chambers and robots. For example, the system controller 357 can be a computer including a central processing unit (CPU) 392, memory 394, inputs/outputs 396, suitable circuits 398, and storage.

Processes may generally be stored in the memory of the system controller 357 as a software routine that, when executed by the processor, causes the process chamber to perform processes of the present disclosure. The software routine may also be stored and/or executed by a second processor (not shown) that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general-purpose computer into a specific purpose computer (controller) that controls the chamber operation such that the processes are performed.

In some embodiments, the system controller 357 has a configuration to control the rapid thermal processing chamber to crystallize the template material.

In one or more embodiments, a processing tool comprises: a central transfer station comprising a robot configured to move a wafer; a plurality of process stations, each process station connected to the central transfer station and providing a processing region separated from processing regions of adjacent process stations, the plurality of process stations comprising a template deposition chamber and a template crystallization chamber; and a controller connected to the central transfer station and the plurality of process stations, the controller configured to activate the robot to move the wafer between process stations, and to control a process occurring in each of the process stations.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods and does not pose a limitation on the scope unless otherwise claimed. No language in the specification should be construed as indicating any non-claimed element as essential to the practice of the disclosed materials and methods.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A method of forming a semiconductor device, the method comprising:

forming a gate structure on a superlattice structure, the superlattice structure on a top surface of a semiconductor substrate and comprising a plurality of horizontal channel layers and a corresponding plurality of semiconductor material layers alternatingly arranged in a plurality of stacked pairs;

depositing a dielectric spacer layer on the gate structure and on the superlattice structure;

removing a portion of the dielectric spacer layer to expose the plurality of horizontal channel layers and the plurality of semiconductor material layers;

forming a source trench and a drain trench adjacent to the superlattice structure;

forming a bottom dielectric isolation layer under the source trench and the drain trench and under the superlattice structure;

forming an inner spacer layer on the plurality of semiconductor material layers of the superlattice structure;

laterally etching a portion of the inner spacer layer to form a recessed region between the plurality of horizontal channel layers;

depositing a template material continuously on the superlattice structure, in the recessed region, on the dielectric spacer layer, and in the source trench and in the drain trench;

removing the template material from the dielectric spacer layer and leaving the template material in the recessed region;

crystallizing the template material and the plurality of horizontal channel layers by one or more of rapid thermal processing (RTP) anneal or laser anneal; and forming a source region in the source trench on the bottom dielectric isolation layer and a drain region in the drain trench on the bottom dielectric isolation layer.

2. The method of claim 1, wherein the template material is amorphous.

3. The method of claim 2, wherein the template material comprises one or more of silicon (Si), silicon germanium (SiGe), titanium (Ti), zirconium (Zr), and hafnium (Hf).

4. The method of claim 2, wherein the template material has a thickness in a range of from 2 nm to 50 nm.

5. The method of claim 1, wherein the plurality of semiconductor material layers and the plurality of horizontal channel layers independently comprise one or more of silicon germanium (SiGe) and silicon (Si).

6. The method of claim 1, wherein forming the source region and the drain region comprises growing an epitaxial layer thereon.

7. The method of claim 1, wherein the source region and the drain region are independently doped with one or more of phosphorus (P), arsenic (As), boron (B), and gallium (Ga).

8. The method of claim 1, wherein the bottom dielectric isolation layer comprises one or more of silicon oxide (SiOx), silicon nitride (SiN), silicon carbide (SiC), and a high-K material.

9. The method of claim 1, wherein the gate structure comprises one or more of tungsten (W), cobalt (Co), molybdenum (Mo), ruthenium (Ru), titanium nitride (TiN), tantalum nitride (TaN), titanium aluminum (TiAl), and N doped polysilicon.

10. A method of forming a semiconductor device, the method comprising:

forming a superlattice structure on a top surface of a bottom dielectric isolation layer on a substrate, the superlattice structure comprising a plurality of horizontal channel layers and a corresponding plurality of semiconductor material layers alternatingly arranged in a plurality of stacked pairs;

forming a gate structure on a top surface of the superlattice structure;

forming a dielectric layer on the gate structure and on the superlattice structure;

forming a source trench and a drain trench adjacent to the superlattice structure on the bottom dielectric isolation layer on the substrate;

forming an inner spacer layer on the plurality of semiconductor material layers of the superlattice structure;

laterally etching a portion of the inner spacer layer to form a recessed region between the plurality of horizontal channel layers;

depositing a template material continuously on the superlattice structure, in the recessed region, on the dielectric layer, and in the source trench and in the drain trench;

removing the template material from the dielectric layer and leaving the template material in the recessed region on the inner spacer layer;

annealing the substrate to crystallize the template material and the plurality of horizontal channel layers by one or more of rapid thermal processing (RTP) anneal or laser anneal; and forming a source region in the source trench on the bottom dielectric isolation layer and a drain region in the drain trench on the bottom dielectric isolation layer.

11. The method of claim 10, wherein the template material is amorphous and has a thickness in a range of from 2 nm to 50 nm.

12. The method of claim 11, wherein the template material comprises one or more of silicon (Si), silicon germanium (SiGe), titanium (Ti), zirconium (Zr), and hafnium (Hf).

13. The method of claim 10, wherein the plurality of semiconductor material layers and the plurality of horizontal channel layers independently comprise one or more of silicon germanium (SiGe) and silicon (Si).

14. The method of claim 10, wherein forming the source region and the drain region comprises growing an epitaxial layer thereon.

15. The method of claim 10, wherein the source region and the drain region are independently doped with one or more of phosphorus (P), arsenic (As), boron (B), and gallium (Ga).

16. The method of claim 10, wherein the bottom dielectric isolation layer comprises one or more of silicon oxide (SiOx), silicon nitride (SiN), silicon carbide (SiC), and a high-K material.

17. A method of forming a semiconductor device, the method comprising:

laterally etching a portion of an inner spacer layer on a plurality of semiconductor material layers of a superlattice structure, the superlattice structure comprising a plurality of horizontal channel layers and the plurality of semiconductor material layers alternatingly arranged in a plurality of stacked pairs, the superlattice structure on a bottom dielectric isolation layer extending between a source trench and a drain trench, wherein laterally etching the portion of the inner spacer forms a recessed region between the plurality of horizontal channel layers;

depositing a template material continuously on the superlattice structure, in the recessed region, and in the source trench and in the drain trench;

removing a portion of the template material but leaving the template material in the recessed region on the inner spacer layer;

annealing the substrate to crystallize the template material and the plurality of horizontal channel layers by one or more of rapid thermal processing (RTP) anneal or laser anneal; and forming a source region in the source trench on the bottom dielectric isolation layer and a drain region in the drain trench on the bottom dielectric isolation layer.

18. The method of claim 17, wherein the template material is amorphous.

19. The method of claim 17, wherein the template material comprises one or more of silicon (Si), silicon germanium (SiGe), titanium (Ti), zirconium (Zr), and hafnium (Hf).

20. The method of claim 17, wherein the template material has a thickness in a range of from 2 nm to 50 nm.

* * * * *